United States Patent [19]

Carlson et al.

[11] Patent Number: 4,928,626
[45] Date of Patent: May 29, 1990

[54] REACTANT GAS INJECTION FOR IC PROCESSING

[75] Inventors: David K. Carlson, Santa Clara; Paul R. Lindstrom, Aptos, both of Calif.

[73] Assignee: Applied Materials, Inc., Santa Clara, Calif.

[21] Appl. No.: 353,929

[22] Filed: May 19, 1989

[51] Int. Cl.$^5$ ............................................. C23C 16/00
[52] U.S. Cl. ..................................... 118/715; 118/730; 156/611; 427/248.1
[58] Field of Search ............... 118/715, 724, 725, 730; 156/611; 204/298; 427/248.1

[56] References Cited

U.S. PATENT DOCUMENTS 4,649,859  3/1987  Wanlass ............................... 118/715

FOREIGN PATENT DOCUMENTS 60-215594  10/1985  Japan .................................... 156/611
592438  2/1978  U.S.S.R. .............................. 156/611
598630  3/1978  U.S.S.R. .............................. 118/715

Primary Examiner—Richard Bueker
Assistant Examiner—Terry J. Owens
Attorney, Agent, or Firm—Paul L. Hickman; Clifton Anderson

[57] ABSTRACT

An epitaxial reactor system provides for enhanced gas flow control and, thus, deposition uniformity. Gross reactant gas flow is set by a main flow controller which delivers unequal amounts to a reaction chamber via two nozzle assemblies. A supplemental flow controlled by an auxiliary flow controller is used to balance the flow rates through the nozzle assemblies so as to reduce spiralling of the gas flow within the chamber. Vertical ridges on a shroud within the reaction chamber help guide incoming gases vertically, further minimizing spiralling. The direction of gas flow from each nozzle assembly is controlled by two actuators, one controlling orientation along a coarse diagonal to obtain an overall vertical uniformity of deposition; the other actuator controls orientation along a fine diagonal to balance inter- and intra-wafer deposition uniformity. This arrangement optimizes the convenience in attaining vertical uniformity. Within each nozzle assembly, a nozzle includes an apertured ball which pivots between two TEFLON rings which are urged against the ball by a lock nut. The compression and frictional forces are adjusted so that a nozzle orientation can be maintained while allowing orientation to be changed by applying force through the actuators. This avoids having to disassemble components to reorient the nozzles.

10 Claims, 3 Drawing Sheets

REACTANT GAS INJECTION FOR IC PROCESSING

BACKGROUND OF THE INVENTION

The present invention relates to semiconductor processing and, more particularly, to thermal reactors used for epitaxial deposition and processes with similar requirements. A major objective of the present invention is to provide for improved gas injection for a barrel reactor to enhance epitaxial deposition uniformity.

Much of recent technological progress is identified with increasingly miniature integrated circuits which have been providing greater functional density at lower costs. Semiconductor processing technology has provided for increased functionality, in part, by permitting smaller features to be patterned onto a semiconductor wafer, and has provided for lower costs, in part, by developing equipment which can handle larger wafers, thereby increasing the number of circuits that can be made together. Fabricating smaller features requires thinner layers to be deposited and observance of the stricter tolerances they require. These stricter tolerances place increased demands of deposition uniformity across a wafer. Since larger wafers are being used, this greater uniformity must be attained over larger areas.

Epitaxial deposition is the deposition of a single crystal layer on a substrate such that the crystal structure of the layer is an extension of the crystal structure of the substrate. Epitaxial deposition permits the fabrication of bipolar integrated circuits and other devices with higher switching speeds, breakdown voltages and current handling ability. Most commonly, a silicon epitaxial layer is deposited on a silicon substrate, but different substrate materials can be used and the epitaxial layer need not be of the same material as the substrate.

Epitaxial deposition involves exposing a substrate to appropriate reactant gases under carefully controlled conditions including elevated temperatures and sub-ambient pressures. Typically, the substrate is etched, e.g., using hydrogen chloride gas, to prepare nucleation sites prior to deposition. A silicon epitaxial layer can then be deposited using hydrogen reduction of silicon tetrachloride ($SiCl_4$) or pyrolysis of silane ($SiH_4$). Other reactant gases are used less commonly, e.g., trichlorosilane ($SiHCl_3$) and dichlorosilane ($SiHCl_2$). To date, the foregoing vapor deposition techniques have yielded higher quality epitaxial layers than have been attained using sputtering or evaporation techniques.

Three thermal reactor designs are commonly used for epitaxial deposition, namely, vertical reactors, horizontal reactors and barrel reactors. In a vertical reactor, reactant gases enter and spent gases exit a bell-jar chamber vertically through its bottom. The gases swirl within the chamber to react at the surface wafers supported by a horizontally-oriented disk-shaped susceptor. The susceptor, in this and in the other designs, serves to convert energy from a source external to the reaction chamber to the heat require to promote the desired deposition reaction at the wafer. The susceptor rotates, helping to maintain a uniform temperature on the susceptor and to distribute reactant gases throughout the chamber.

In a horizontal reactor, reactant gases enter at one end of a horizontally extending tube and are exhausted out the other end. Both rotating and non-rotating susceptors can be used. The susceptor can be inclined a few degrees from the horizontal so that used gas is introduced at every wafer position.

A barrel reactor combines features of both the horizontal and vertical designs. A susceptor with faces slightly inclined relative to a vertical axis rotates within a bell-jar chamber. Wafers are placed in vertical rows on each susceptor face while reactant gas, introduced at the top of the chamber, flows downwardly over the wafers and is exhausted from the chamber bottom. The barrel reactor is generally favored because it permits precise depositions on a large number of wafers at once. Along with the advantage of greater wafer capacity comes the challenge of ensuring deposition uniformity from wafer to wafer, as well as uniformity across individual wafers.

Deposition uniformity in a barrel reactor is sensitive to the reactant gas flow pattern, which is in turn dependent on the way that the gases are introduced into the chamber. In one approach to gas injection for a barrel reactor, a pair of nozzles are disposed near the top of the chamber and symmetrically relative to a plane which bisects the chamber vertically. The nozzles are oriented so that their respective jets collide, resulting in a combined gas flow which is directed primarily downward through the chamber and over the vertically supported wafers.

Since chamber gas flow at the wafer results from the collision of gas jets, it is apparent that precise control over the balance and orientation of the gas jets is critical to deposition uniformity. If one jet is stronger, a lateral or spiral component to the gas flow could result, impairing deposition uniformity. Similar problems occur if the nozzles are not oriented symmetrically. Where the jets are balanced and the nozzle are oriented symmetrically, consideration must be given to the precise orientations of the nozzles to ensure deposition uniformity. Thus, the elevation and azimutal position of the nozzles must be determined. The correct nozzle orientations can vary according to gas flow rate, thermal conditions, and the reaction rate for the selected deposition reaction.

In an illustrative barrel reactor, each nozzle includes a tube which extends from a spherical element which serves as a ball joint. During normal operation, the ball joint is clamped between a metal ring and a front wall of a tubular housing for the nozzle. The metal ring is held in place by a set screw which can be loosed to permit adjustment of the nozzle orientation. Proper alignment can be achieved by inserting a Cartesian grid near the target intersection of the shroud and bisecting plane. A needle can be inserted into each nozzle and the distal end of the needle can be aligned with a selected point on the grid. Once the desired orientation is attained, the set screw is tightened and the needle removed. This procedure is then repeated for the other nozzle. The nozzles are coupled through similar conduits and valves to a common gas source. The valves can be adjusted to obtain the desired jet flow balance.

While the illustrative barrel reactor has been very successful from commercial and technical perspectives, refinements are required to accommodate the stricter tolerances that are sure to be imposed by advancing technology and market demands. The described nozzle alignment approach is somewhat inconvenient and unreliable since it generally requires some disassembly, e.g., removal of the gas lines connected to the chamber, to be implemented. The adjustment mechanisms are cumbersome in that a change in a reaction parameter can require disassembly and ad hoc adjustments to each nozzle and each valve, with each adjustment potentially requiring further adjustments for the other valve or nozzle. Thus, determining the correct nozzle orientations and valve positions can be time consuming. Finally, even when the proper jet strengths and nozzle orientations are achieved, there can still be problems obtaining the desired level of deposition uniformity.

What is needed in a gas injection system for a barrel-design epitaxial reactor which provides for a reactant gas flow with better promotes both single-wafer and inter-wafer deposition uniformity. Preferably, such a system would provide for more convenient and precise nozzle orientation adjustment and gas jet rate adjustments.

SUMMARY OF THE INVENTION

The present invention comprises a set of related improvements in gas injection for a semiconductor processing reactor. These include the use of ridges on a shroud, or other means, to limit spiralling and lateral gas flow components, the use of a low friction clamp to permit more convenient adjustments of nozzle orientation, the use of coarse and fine diagonal nozzle adjustment actuators more quick and precise selection of nozzle orientation, and the use of an unbalanced coarse gas flow in combined with a fine balancing flow to permit convenient and precise balancing of jet flow rates.

In the context of the barrel design epitaxial reactor, vertical ridges are formed on the shroud near the region where the gas jets collide. The ridges guide the combined gas flow in a vertical direction and limit lateral gas flow components which can lead to spiralling. In connection with the present invention, it has been determined that by minimizing spiralling, the ridges enhance lateral uniformity across a wafer.

Jet flow rates are balanced, ironically, using a deliberately unbalanced gas delivery system. Conduits to each of a pair of nozzles can be coupled to a common gas flow via a common flow controller which is used to set the gross jet flow rate from the reactor. The conduits themselves are designed, e.g., by using different conductance values, so that the gas flow is relatively restricted toward a first of the nozzles so that gas flows preferentially toward the second nozzle. The flow to the first nozzle is supplemented by a secondary flow through a third conduit which has an auxiliary flow controller which permits fine control of the total flow through the first nozzle. Thus, the overall gas flow can be set by the common flow controller while balance can be achieved independently using the auxiliary controller.

This "unbalanced" approach to flow control substantially decouples flow rate and flow balance. Rather than requiring a series of approximation to achieve a desired flow rate or balance, this "unbalanced" approach makes it more likely that a single adjustment can accomplish a desired result, i.e., either a flow rate change or a flow balance change.

Also in accordance with the present invention, each nozzle includes a ball-joint which is clamped between low friction surfaces, for example, surfaces of TEFLON rings. The friction and clamping force are co-selected so that a nozzle orientation can be secured reliably during reactor operation, but can be adjusted as desired with application of moderate forces, e.g., manually applied forces. This arrangement allows adjustments without the inconvenience of loosening set screws and disassembly the reactor. In fact, nozzles can be adjusted from outside the chamber where their conduits exit.

Nozzle adjustment can be effected using a pair of actuators for each nozzle. A pair of actuators are used to obtain two dimensions of movement. The present invention provides that these two dimensions can be along diagonals relative to the chamber axis. The more conventional approach is to provide for azimuthal control relative to an axial injection line through the center target point on the shroud and for elevational control relative to an injection plane through the target point and perpendicular to the chamber axis. In the course of the present invention, it was discovered that vertical variations in deposition thickness correlate most strongly with nozzle orientation changes which are along a diagonal extending from points near the nozzle and below the injection plane to points farther from the nozzle and above the injection plane. The actuator assigned to change nozzle orientation along this "coarse" diagonal can be used to make coarse adjustments deposition uniformity. The actuator controlling the other diagonal can be used to fine tune the coarse adjustment to ensure that conditions of inter-wafer uniformity and intra-wafer uniformity are both met. Thus, the invention provides for more rapid nozzle orientation adjustments by decoupling actions which are responsible respectively for coarse and fine uniformity affects.

In summary, the present invention provides for reduced spiralling of the reactant gas flow within the chamber, more convenient control of total gas flow rate and balance, and more convenient and rapid nozzle orientation adjustments. These and other features and advantages of the present invention are apparent from the description below with reference to the following drawings.

DESCRIPTION OF THE PREFERRED EMBODIMENTS

Figure 2:
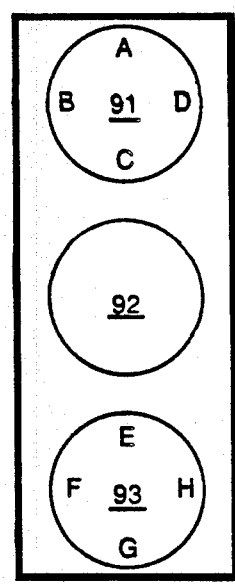
FIG. 2 is an enlarged view of three wafers supported in the reactor of FIG. 1, this view being shown to distinguish different directions along which deposition non-uniformities are addressed by the present invention.

An epitaxial reactor 100, embodying the present invention, comprises a reactor vessel 102 defining a reaction chamber 104, a susceptor 106, a cabinet 108 including a table top 110, an electronics module 112, and a lift assembly 114. Wafers 91–99 are loaded onto depressions in the faces of susceptor 106. The six faces and the wafers they carry are oriented at a small angle from the vertical so that they are closer to a chamber axis 115 at their tops than at their bottoms. Gas is introduced into chamber 104 via a gas ring 116, which is capped by a seal plate 118 and a shroud 120. A combined flow 119 proceeds downwardly and axially through chamber 104; spent gases are evacuated from chamber 104 through an exhaust line 121 via an exhaust flange 122. A lamp module 124, including several infrared lamps 126 and reflectors 127, provides energy to heat wafers 91–99 and susceptor 106 to promote the desired epitaxial deposition reaction.

Electronics module 112 includes a power switch 128 and a manometer readout 130 which represents pressure readings by a capacitance manometer, the probe of which is internal to chamber 104. Electronics module 112 controls rotation of susceptor 106 via stepper motors which are coupled to susceptor 106 through a rotation assembly 132. Electronics module 112 also provides signal conditioning for a radiometer located within susceptor 106 via lines extending through a hanger assembly 134 which extends through shroud 120. Rotation assembly 132 is mounted on a lift casting 136 which is mechanically coupled to susceptor 106, as well as seal plate 118, so that susceptor 106 can be lifted out of chamber 104 by lift assembly 114 for loading wafers 91–99. Vessel 102 is mounted on cabinet 108 via a base plate 138. A pneumatic cylinder 140 effects a seal at exhaust flange 122.

Wafer 91 includes edge regions A, B, C and D, while wafer 93 includes edge regions E, F, G and H, as marked in FIG. 2. Deposition uniformity is achieved by minimizing deposition variations between pairs of these regions. Variations between regions A and C and between E and G are vertical intra-wafer variation. Variations between regions B and D and between F and H are lateral intra-wafer variations. Variations between regions A and G are vertical inter-wafer variations. Variations between regions B and H and between regions D and F are diagonal inter-wafer variations, usually reflecting a gas flow which spirals down through chamber 104.

Figure 3:
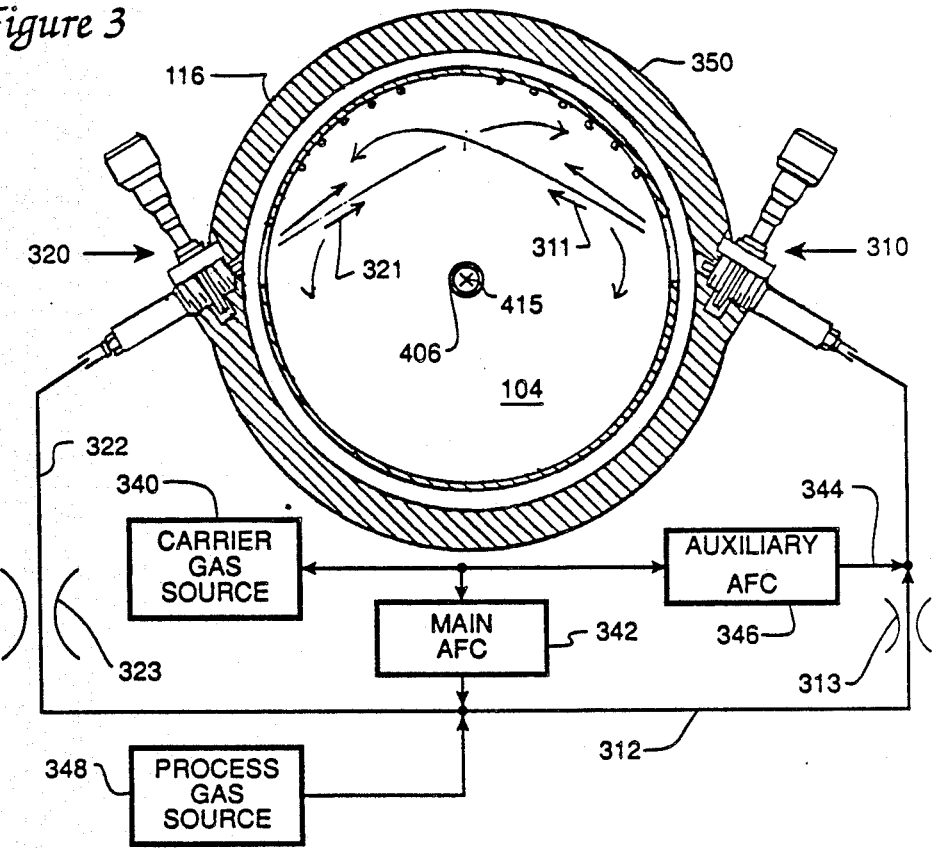
FIG. 3 is a combined schematic sectional view and block diagram of the injection system incorporated in the epitaxial reactor of FIG. 1.

Gas ring 116 supports two nozzle assemblies 310 and 320, which provide respective gas gets 311 and 321, as shown in FIG. 3. A gas source 340 provides the carrier gas for jets 311 and 321. The output of gas AFC 340 is regulated by a main automatic flow controller (ATC) 342. AFC 342 is coupled to nozzle assembly 310 via a first conduit 312 and to nozzle assembly 320 via a second conduit 322. First conduit 312 includes a construction 313 which is narrower than a comparable constriction 323 of conduit 322. Accordingly, the gas flow through nozzle assembly 310 from main AFC 342 is less than the gas flow through nozzle assembly 320.

The gas flow through nozzle assembly 310 is supplemented by a gas flow from a third conduit 344 which carries gas from gas source 340 while bypassing constriction 313. The flow rate through conduit 344 is regulated by an auxiliary AFC 346. The capacity of main AFC 342 is substantially greater than that of AFC 346. Thus, main AFC 342 can be used to control the gross total gas flow through nozzle assemblies 310 and 320 into chamber 104, while auxiliary AFC 346 can be used to fine tune the flow through nozzle assembly 310 so that jets 311 and 321 can be balanced.

Nozzle assemblies 310 and 320 are oriented so that jets 311 and 322 collide so as to cancel much of their lateral flow components. Balancing jets 311 and 321 maximizes this cancellation so that combined gas flow 119 is generally vertical and relatively small lateral vestiges. Thus, an operator can adjust main AFC 342 to regulate the gas flow rate through chamber 104 and can adjust auxiliary AFC 346 to minimize lateral flow components in a combined gas flow. A process gas source 348 introduces process gas to be carried by the carrier gas to chamber 104.

Minimizing lateral flow components lessens spiralling of the gas down through chamber 104. Spiralling can be blamed for lateral intra-wafer non-uniformities, e.g., B–D and F–H non-uniformities, and diagonal inter-wafer non-uniformities such as either a B–H non-uniformity or a D–F non-uniformity, or both.

However, balancing gas jet flow is insufficient to minimize spiralling, since jet collision does not eliminate all lateral flow components. Spiralling can be further minimized by disposing vertical ridges 350 on shroud 120 to channel the combined gas flow vertically.

Figure 1:
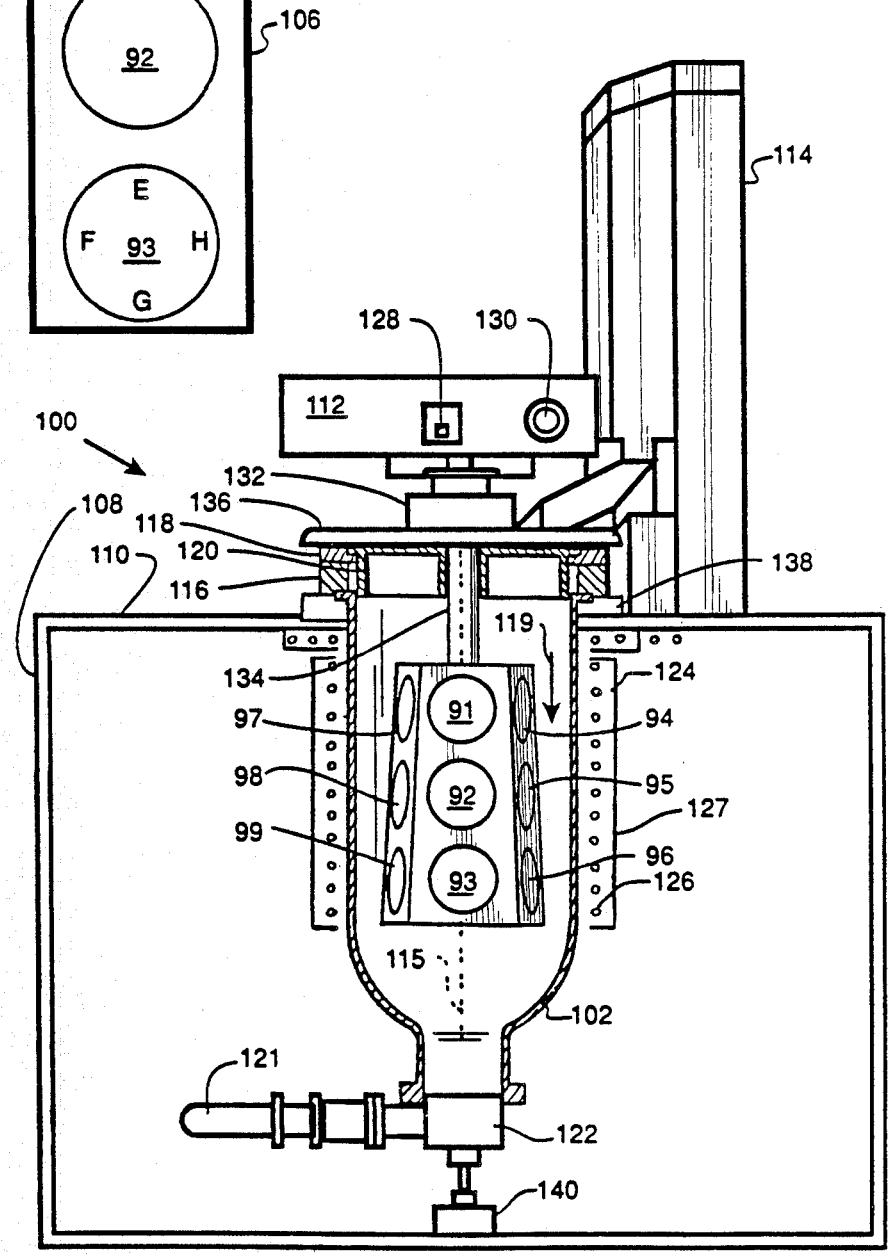
FIG. 1 is a schematic elevational section view of an epitaxial reactor incorporating an injection system in accordance with the present invention.
Figure 4:
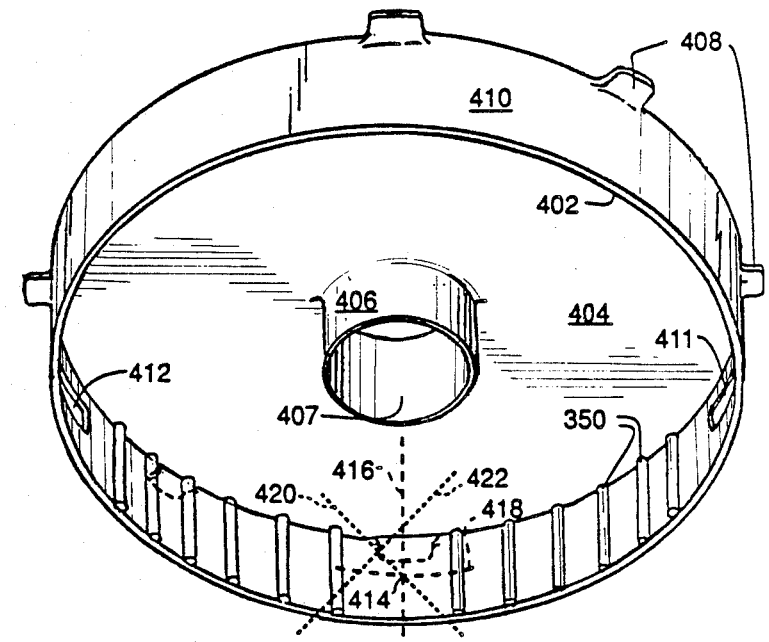
FIG. 4 is a perspective view of a shroud incorporated in the injection system of FIG. 3.

Shroud 120 is roughly the shape of an angel-food cake pan, having a vertically extending peripheral circumferential wall 402, an upper wall 404, and a vertically extending central circumferential wall 406 as shown in FIG. 4. Wall 406 defines a radiometer hole 407 through which hanger assembly 134 of FIG. 1 can extend. Radially extending tabs 408, fused to an outer surface 410 of wall 402, provide for mounting of shroud 120 on seal plate 118 of FIG. 1. Slots 411 and 412 respectively accommodate nozzle assemblies 310 and 320.

Ridges 350 are spaced on about a 1" pitch about the curved segment of wall 402 extending between slots 411 and 412 and including an injection original 414. These ridges must be tall enough to minimize spiralling but not so tall as to disrupt interaction of jets 311 and 321. Ridges 350 extend 4–6 millimeters radially inward from wall 402. Injection origin 414 is a reference for aligning nozzle assemblies 310 and 320. An injection line 416 extends vertically through injection origin 414, and an injection plane 418, indicated by a portion of its intersection with shroud 120, extends through injection origin 414 and perpendicular to injection line 416. Ridges 350 are fused to shroud 120. Shroud 120 and ridges 350 are both of quartz which is bead blasted white to eliminate direct radiation heating of stainless steel seal plate 118. Incidentally, the section of gas ring 116 taken in FIG. 3 is along injection plane 418.

In accordance with the present invention and in the context of epitaxial reactor 100, it has been determined that changing the elevation of a nozzle assembly, i.e., moving its target point on shroud 120 upward relative to injection plane 418, affects vertical inter-wafer uniformity by increasing the deposition rate at point A relative to the rate at region G on FIG. 2. Furthermore, increasing the azimuthal position of the target point from the respective slot for a given nozzle assembly affects intra-wafer vertical uniformity, e.g., increases the deposition rate of region A relative to the rate at region C.

Rather than providing independent controls for the elevational and azimuthal directions, the present invention provides for independent controls along directions which are diagonal to the elevational and azimuthal directions. Diagonals 420 and 422 indicate these directions. Diagonal 420 is the coarse diagonal for nozzle assembly 310 in that changing the target for jet 311 along it maximally changes relative vertical deposition rates. Specifically, moving the target point for jet 311 up and away from nozzle 310 increases both intra-wafer and inter-wafer depositions relative to region A. Thus, movement along diagonal 420 can be used for gross adjustments of vertical deposition rates.

Once a setting along coarse diagonal 420 is selected, movement along diagonal 422 can be used to adjust the balance of intra-wafer and inter-wafer deposition rates. For example, a down and away movement increases the intra-wafer differential and decreases the inter-wafer differential, e.g., the deposition rate at region A increases relative to the rate at region C and decreases relative to the rate at region G. Thus, movements along diagonal 422 can be used to fine tune vertical deposition uniformity. Note that the roles of diagonals 420 and 422 are reversed for nozzle assembly 320: diagonal 422 is its coarse diagonal and diagonal 420 is its fine or balance diagonal.

Figure 5:
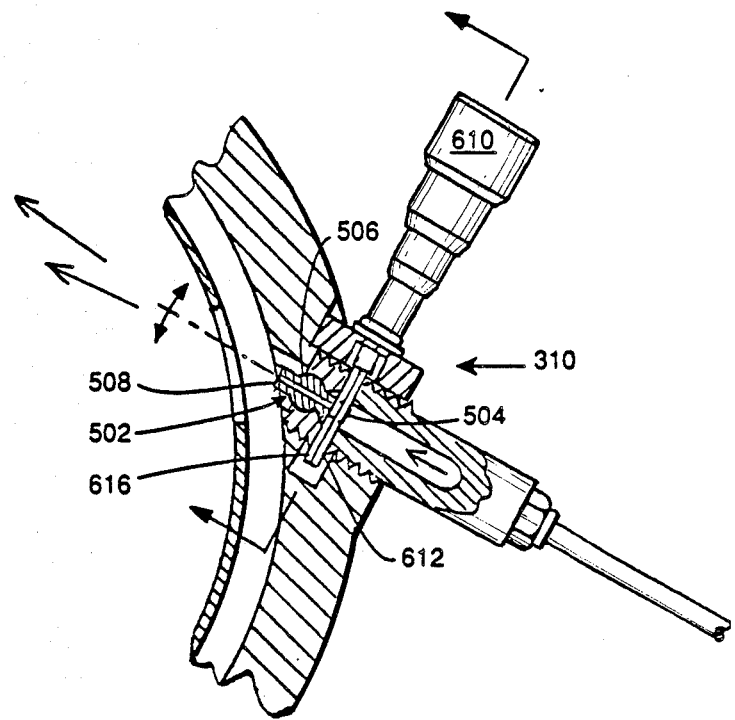
FIG. 5 is an enlarged plan cut-away view of a nozzle assembly of the injection system of FIG. 3.
Figure 6:
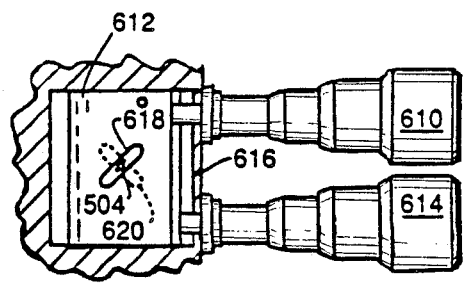
FIG. 6 is an elevational sectional view of an actuator mechanism of the nozzle assembly of FIG. 5.
Figure 7:
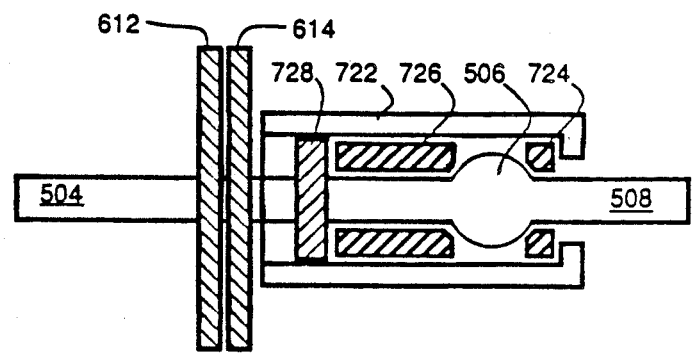
FIG. 7 is a schematic plan sectional view of a ball joint assembly of the nozzle assembly of FIG. 5.

The mechanisms for moving the jet target point along diagonals 420 and 422 are illustrated in FIGS. 5–7 for nozzle 310. Nozzle assembly 310 includes a nozzle 502, which includes an inlet tube 504, an apertured ball 506 and an outlet tube 508, shown in FIGS. 5 and 7. Nozzle assembly 310 further comprises a coarse motion actuator 610, a coarse motion plate 612, a fine motion actuator 614 and a fine motion plate 616, shown in FIG. 6. Coarse motion plate 612 includes a slot 618 and fine motion plate 616 includes a slot 620. The direction of elongation of slot 620 is orthogonal to the direction of elongation of slot 618. Inlet tube 504 extends through both slots 618 and 620.

When coarse motion actuator 610 is rotated counter-clockwise, coarse motion plate 612 moves in the direction of the actuators (right in FIG. 6). This moves inlet tube 504 toward the actuators and down. Nozzle 502 pivots on ball 506 so that outlet tube 508 is moved away (leftward) and up along diagonal 420 of FIG. 4; rotating coarse motion actuator 610 clockwise causes the opposite motion along diagonal 420. Thus, coarse motion actuator 610 effects coarse control of uniformity. Fine motion 614 similar effects changes of direction along diagonal 422 to balance intra-wafer and inter-wafer uniformity. Similar actuators for nozzle assembly 320 provide similar control.

As indicated in FIG. 7, nozzle assembly 310 includes a nozzle housing 722, a forward ring 724, and a rearward ring 726, cooperatively confining nozzle 502. Rings 724 and 726 are slightly chamfered (the chamber is exaggerated in FIG. 7); too much chamfer can reduce locking ability below that desired. A locking nut 728 is tightened sufficiently to obtain a desired level of friction which can support nozzle 502 and yet permit its reorientation when an appropriate level of force is applied via actuators 612 and 614.

Rings 724 and 726 are of low friction material specifically, polytetrafluorethylene (PTFE-TEFLON). VESPEL and PEEK are also suitable low friction materials. Ring 724 is ¼" axially, and has an inner diameter of about 5/16" and an outer diameter of about ½". Ring 726 is similar except that it extends about 1" axially. Ball 506 is of 316 stainless steel and about 7/16" in diameter. Outlet tube 508 is about 1" long. Features of reactor system 100 that are similar to the prior art are further defined by their counterparts on a Precision 7810 EPI, epitaxial reactor manufactured by Applied Material, Incorporated.

As is apparent to those skilled in the art, many modifications to the disclosed embodiment can be made while retaining the essential features of the invention. Reactions other than epitaxial depositions can be provided for. Non-silicon processes can be implemented. Different materials and dimensions can be used for the various components. Some features of the invention can be used without other features of the invention. These and other variations upon and modifications to the described embodiments are provided for by the present invention, the scope of which is limited only by the following claims.

What is claimed is:

1. In a thermal reactor for semiconductor processing, a gas injection system comprising:

a reaction chamber, said chamber having a chamber axis of symmetry generally parallel to which semiconductor wafers are arranged so that reactant gas flowing generally parallel to said chamber axis can interact with major surfaces of said wafers, said chamber including a shroud means for diverting injected gas, said shroud means including an injection origin defining an injection plane therethrough perpendicular to said chamber axis and an injection line therethrough parallel to said chamber axis;

a first nozzle for injecting a first gas jet into said chamber along a first path toward said shroud;

a second nozzle for injecting a second gas jet into said chamber along a second path toward said shroud;

nozzle control means for controlling said first and second nozzles so that said first and second gas jets flow at least partially against each other and against said shroud to promote a combined gas flow generally parallel to said chamber axis, said nozzle control means providing for direction control of each of said first and second nozzles so that the direction of each gas jet can be changed azimuthally relative to said injection line and in elevation relative to said injection plane to control said combined gas flow; and gas source means for providing reactant gas flow to said first and second nozzles for introduction into said chamber;

a coarse flow controller for providing a relatively coarsely regulated gas flow from said gas source, said first coarse flow controller having a coarse control input for controlling the rate of gas flow therethrough;

a first conduit for conveying gas provided by said coarse flow controller to said first nozzle a second conduit for conveying gas provided by said coarse flow controller to said second nozzle, said first and second conduits being designed so that more of the gas flow provided by said coarse flow controller is directed through said first nozzle than through said second nozzle;

a third conduit for conveying gas from said gas source to said first nozzle; and a fine flow controller for providing a relatively finely regulated gas flow from said gas source through said third conduit, said fine flow controller having a fine control input for controlling the rate of gas flow through said third conduit so that the gas flows through said first and second nozzles can be precisely balanced.

2. The gas injection system of claim 1 wherein each of said nozzles comprises a nozzle outlet tube mounted on a ball pivot, said ball pivot being supported by low friction bearings so that the orientation of said nozzle outlet tube is maintain in the absence of significant force orthogonal thereto and so that the orientation of said nozzle outlet tube can be changed by applying substantial force orthogonal to said nozzle outlet tube.

3. The gas injection system of claim 1 wherein said nozzle control means includes substantially identical first and second jet, said second jet control means being physically coupled to said second nozzle for controlling the direction of said second jet, said first control means, said first jet control means being physically coupled to said first nozzle for controlling the direction of said first jet control means including a coarse actuator and a fine actuator, said coarse actuator being coupled to said first nozzle so as to control the direction of said first jet along a coarse diagonal extending from points on said shroud below said injection plane and relatively near said first nozzle to points on said shroud above said injection plane and relatively far from said first nozzle, said fine actuator being coupled to said first nozzle so as to control the direction of said first jet along a fine diagonal extending from points on said shroud above said injection plane and relatively near said first nozzle to points on said shroud below said injection plane and relatively far from said first nozzle.

4. The gas injection system of claim 1 wherein said shroud includes ridges extending parallel to said chamber axis so as to guide the combined gas flow from said nozzles generally parallel to said chamber axis while limiting non-axial components of said combined gas flow.

5. In a thermal reactor for semiconductor processing, a gas injection system comprising:
   a reaction chamber, said chamber having a chamber axis of symmetry generally parallel to which semiconductor wafers are arranged so that reactant gas flowing generally parallel to said chamber axis can interact with major surfaces of said wafers;
   a first nozzle for injecting a first gas jet into said chamber along a first path;
   a second nozzle for injecting a second gas jet into chamber along a second path, said second path intersecting said first path so that said first and second gas jets interact to define a combined gas flow;p and
   shroud means for diverting said combined gas flow in a direction generally parallel to said chamber axis, said shroud means including ridges aligned substantially parallel to said chamber axis so as to limit spiralling of said combined gas flow within said chamber.

6. In a thermal reactor for semiconductor processing, a gas injection system comprising:
   a reaction chamber, said chamber having a chamber axis of symmetry generally parallel to which semiconductor wafers are arranged so that reactant gas flowing generally parallel to said chamber axis can interact with major surfaces of said wafers, said chamber including a shroud means for diverting injected gas, said shroud means including an injection origin defining an injection plane therethrough perpendicular to said chamber axis and an injection line therethrough parallel to said chamber axis;
   gas source means for providing reactant gas flow to said first and second nozzles for introduction into said chamber;
   a first nozzle for injecting a first gas jet into said chamber along a first path toward said shroud, said first nozzle being in fluid communication with said gas source and said chamber;
   a second nozzle for injecting a second gas jet into said chamber along a second path toward said shroud, wherein each of said nozzles comprises a nozzle tube mounted on a ball pivot, said ball pivot being supported by low friction bearings so that the orientation of said nozzle tube is maintain in the absence of significant force orthogonal thereto and so that the orientation of said nozzle tube can be changed by applying substantial force orthogonal to said nozzle tube, said second nozzle being in fluid communication with said gas source and said chamber; and
   nozzle control means for controlling said first and second nozzles so that said first and second gas jets flow at least partially against each other and against said shroud to promote a combined gas flow generally parallel to said chamber axis, said nozzle control means providing for direction control of each of said first and second nozzles so that the direction of each gas jet can be changed azimuthally relative to said injection line and in elevation relative to said injection plane to control said combined gas flow.

7. In a thermal reactor for semiconductor processing, a gas injection system comprising:
   a reaction chamber, said chamber having a chamber axis of symmetry generally parallel to which semiconductor wafers are arranged so that reactant gas flowing generally parallel to said chamber axis can interact with major surfaces of said wafers, said chamber including a shroud means for diverting injected gas, said shroud means including an injection origin defining an injection plane therethrough perpendicular to said chamber axis and an injection line therethrough parallel to said chamber axis;
   a first nozzle for injecting a first gas jet into said chamber along a first path toward said shroud;
   a second nozzle for injecting a second gas jet into said chamber along a second path toward said shroud;
   gas source means for providing reactant gas flow to said first and second nozzles for introduction into said chamber; and
   nozzle control means for controlling said first and second nozzles so that said first and second gas jets flow at least partially against each other and against said shroud to promote a combined gas flow generally parallel to said chamber axis, said nozzle control means providing for direction control of each of said first and second nozzles so that the direction of each gas jet can be changed azimuthally relative to said injection line and in elevation relative to said injection plane to control said combined gas flow, said nozzle control means including substantially identical first and second jet control means, said first jet control means being physically coupled to said first nozzle for controlling the direction of said first jet, said second jet control means being physically coupled to said second nozzle for controlling the direction of said second jet, said first jet control means including a coarse actuator and a fine actuator, said coarse actuator being coupled to said first nozzle so as to control the direction of said first jet along a coarse diagonal extending from points on said shroud below said injection plane and relatively near said first nozzle to points on said shroud above said injection plane and relatively far from said first nozzle, said fine actuator being coupled to said first nozzle so as to control the direction of said first jet along a fine diagonal extending from points on said shroud above said injection plane and relatively near said first nozzle to points on said shroud below said injection plane and relatively far from said first nozzle.

8. A method of injecting gas into a barrel-type reaction chamber having first and second nozzles, said method comprising the steps of:
providing a main flow of gas for injection into said chamber;
dividing said main flow between said first and second nozzles so that the flow through said second nozzle is greater than through said first nozzle;
supplementing said main flow with an auxiliary flow through said first nozzle; and
adjusting said auxiliary flow so that the combined main and auxiliary flow through said first nozzle is substantially equal to said flow through said second nozzle.

9. A method of injecting gas into a barrel-type reaction chamber, said chamber having a chamber axis, said method comprising the steps of:
orienting a first nozzle so that a first gas jet therethrough can flow generally parallel to a plane perpendicular to said chamber axis;
orienting a second nozzle so that a second gas jet therethrough can flow generally parallel to said plane and collide with said first jet;
injecting gas into said chamber through said nozzles so that said first and second jets collide near a shroud to define a combined gas flow;
diverting said combined gas flow with ridges attached to said shroud and extending substantially parallel to said axis so that said combined gas is guided parallel to said axis.

10. A method of orienting gas injection nozzles of a barrel-type reaction chamber, said chamber having an axis of symmetry generally parallel to which first and second semiconductor wafers are oriented and relatively disposed so that process gas flowing generally parallel to said chamber axis can interact with major surfaces of said wafers, said chamber including a shroud means for diverting injected gas, said shroud means including an injection origin defining an injection plane therethrough perpendicular to said chamber axis and an injection line therethrough parallel to said chamber axis, said method comprising the steps of:
changing the direction of each nozzle along a coarse diagonal extending from points on said shroud below said injection plane and relatively near that nozzle to points on said shroud above said injection plane and relatively far from that nozzle until the overall vertical process uniformity between said first and second wafers and within each of said first and second wafers is optimized; and then
changing the direction of each nozzle along a fine diagonal extending from points on said shroud above said injection plane and relatively near aid first nozzle to points on said shroud below said injection plane and relatively far from said first nozzle to balance inter-and intra-wafer vertical process uniformity.

* * * * *